United States Patent
Kim et al.

(10) Patent No.: US 7,486,757 B2
(45) Date of Patent: Feb. 3, 2009

(54) OPTICAL DRIVER INCLUDING A MULTIPHASE CLOCK GENERATOR HAVING A DELAY LOCKED LOOP (DLL), OPTIMIZED FOR GIGAHERTZ FREQUENCIES

(75) Inventors: Ho-young Kim, Seoul (KR); Yong-sub Kim, Yongin (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 628 days.

(21) Appl. No.: 11/058,826

(22) Filed: Feb. 16, 2005

(65) Prior Publication Data

US 2006/0045222 A1 Mar. 2, 2006

(30) Foreign Application Priority Data

Aug. 26, 2004 (KR) .................. 10-2004-0067431

(51) Int. Cl.
*H03D 3/24* (2006.01)
(52) U.S. Cl. .................. 375/373; 375/376; 375/374; 375/375; 369/59.11; 369/59.12; 368/156
(58) Field of Classification Search ......... 375/373–376; 369/59.11, 59.12, 47.52; 368/156
See application file for complete search history.

(56) References Cited

U.S. PATENT DOCUMENTS 4,149,146 A * 4/1979 Ebihara et al. .............. 368/156
6,211,714 B1 * 4/2001 Jeong ......................... 327/293
6,687,208 B2 * 2/2004 Asada et al. .............. 369/59.11
6,711,107 B2 * 3/2004 Chao et al. ................ 369/47.52
6,775,217 B1   8/2004 Kato et al. ..................... 369/59
7,200,091 B2 * 4/2007 Masui et al. .............. 369/59.11
2001/0021051 A1 * 9/2001 Kim ............................ 359/161
2002/0005841 A1 * 1/2002 Jung et al. ................... 345/204
2003/0156520 A1   8/2003 Han ........................ 369/59.11
2003/0215029 A1  11/2003 Block et al.
2003/0215039 A1 * 11/2003 Block et al. ................. 375/376
2004/0081053 A1   4/2004 Kojima .................... 369/59.11

FOREIGN PATENT DOCUMENTS

EP        1 304 686        4/2003

* cited by examiner

*Primary Examiner*—Phuong Phu
(74) *Attorney, Agent, or Firm*—F.Chau & Associates, LLC

(57) ABSTRACT

An optical (disc) driving system including the DLL based multiphase clock generator circuit capable of generating 32 different phases from input clock having a frequency of 800 MHz or greater. The multiphase clock generator includes on a delay locked loop (DLL) having a frequency divider for outputting an N-divided clock to a first set of M voltage-controlled delay cells within a feedback loop, and further including an identical set of M voltage-controlled delay cells outside of the feedback loop for delaying the undivided clock and for outputting M multiphase clocks.

An optical driver circuit of an optical driving system and a method for implementing a write-strategy for preventing "overlapping" of marks written on adjacent grooves on an optical disc. The circuit and method produce multiple write-strategy waveforms (channels) switching at a high resolution (e.g., T/32) in the Gigahertz frequency range.

21 Claims, 16 Drawing Sheets

OPTICAL DRIVER INCLUDING A MULTIPHASE CLOCK GENERATOR HAVING A DELAY LOCKED LOOP (DLL), OPTIMIZED FOR GIGAHERTZ FREQUENCIES

BACKGROUND OF THE INVENTION

1. Field of the Invention

The present invention relates to an optical media disc driver circuit and in particular, an optical driver circuit having a multiphase clock generator including a delay locked loop (DLL) circuit.

2. Description of the Related Art

DVD±R discs, which record data once, store data by using changes in the reflectivity of a photosensitive material on the disc. The system shines a tightly focused, relatively high-power, 650-nanometer (nm) red laser beam onto the surface of the DVD. The light causes a permanent change in the reflectivity of the disc's surface. Information can then be recovered by illuminating the disc's surface with a lower-powered laser light. A detector receives the reflected laser light, and the system uses the varying reflectivity to re-create the original data with great integrity. DVD±RW discs utilize temperature-induced phase changes in a very thin metal alloy layer deposited on the surface of the disc. The material is designed to have two stable, solid states. The disc can store data because these states have different reflectivity characteristics. The system recovers data in the same way as for a write-once disc.

Driving circuits for writing to optical storage media such as a Compact Disc Player (CDP), a Digital Video Disc Player (DVDP), a CD-RW (Rewritable Compact Disc), a CD-ROM (Compact Disc Read Only Memory), a CD-R (Recordable compact disc), a DVD-RAM, or a DVD-ROM etc. generally use a PLL (phase locked loop) circuit or a DLL (delay locked loop) circuit for generating a number of clock signals (hereinafter referred to as "multiphase clocks") for data modulation/demodulation and for synchronizing/serializing data at high speed.

A phase-lock-loop or a delay-locked-loop (PLL) circuit is usually used as a multiphase clock generator for generating multiphase clock signals. A PLL circuit uses a voltage controller and a phase comparator. Similarly, a DLL (delay locked loop) circuit uses delay cells and a phase comparator circuit to generate the multiphase clock signals. Generally, a circuit including a DLL has better jitter characteristics than a circuit including a PLL.

With increasing demand for higher optical disc burning (and reading) speeds, it has been difficult to meet the need for high-speed delay-locked loops (DLLs). For example, it is not easy to increase the frequency of voltage-controlled delays (non-inverting buffers) included in a DLL to a high frequency approaching or above a GHz level (because propagation delay of such delay cells produced is constrained by the manufacturing process).

When serial data are transmitted or received at high speed, multiphase clock signals are needed. The multiphase clock signals generated are synchronized to the input clock (sync) signals. Each of the multiphase clock signals has a phase difference (relative to the input clock (sync) signals) and the same interval (period) as between input clock (sync) signals.

FIG. 1 is a circuit block diagram illustrating a conventional starved-current (voltage controlled) inverter type DLL (delay locked loop) used as a multiphase clock generator. The conventional DLL of FIG. 1 generates and outputs a number M of multiphase clocks (e.g., for sampling a character (M=32 symbol bits) in the receiver circuit) synchronized to a 800 MHz frequency. The receiver requires 32 phase clock signals. Operating from an input clock at 800 MHz, the 32 phase clocks operate at 32×800 MHz or at 25.6 Gbits/sec. Therefore, one "step" delay (between successive multiphase clocks) is 39.06 psec (1/(32×800 [MHz])=39.06 [psec]).

A starved-current (voltage controlled) inverter type DLL uses delay cells which typically have a propagation delay ("Low-to-High" or "High-to-Low") of less than 50 psec. To decrease the delay at each cell, the total power consumption of the delay locked loop circuit is increased and circuit size may be increased. Therefore, the conventional delay locked loop circuit is inappropriate for an optical driving system requiring high frequency operation at 800 MHz or more (e.g., gigahertz frequencies).

The conventional DLL (delay locked loop) circuit of FIG. 1 has a delay chain (11), a phase detector (13), a charge pump (15) and a loop filter (17). The delay chain (11) includes a plurality M of delay cells (111, 112, 113, ... 11M) that each delays an input clock signal (CLKIN) in response to a control voltage (VCON). Each of the delay cells (111 to 11M) respectively has a delay time ($\Delta$) corresponding to T/M (where T is the period of the input clock signal(CLKIN). For example, if the frequency (f) of an input clock signal (CLKIN) is 800 MHz and the number of delay cells (111-11M) is 32 (i.e., M=32), the delay time ($\Delta$) of each of the delay cells (111-11M) is 39.06 picoseconds (1/(f×M)=1/(800×10$^6$×32)= 39.06×10$^{-12}$ sec).

FIG. 2 is a timing diagram illustrating plural clock signals generated from the DLL (delay locked loop) circuit of FIG. 1. The clock signals (CLK<1> to CLK<M>) have M (where M is an integer greater than one) different phases respectively, are output from the plurality M of delay cells (111 to 11M) respectively.

Referring to FIG. 1, the phase detector (13) generates an UP signal or a DOWN signal corresponding to a detected phase difference between output clock signals. The charge pump (15) sources or sinks a prescribed current to an output unit. The loop filter (17) generates a control voltage (VCON) by filtering the charge pump (15) output.

Hence, if a current supplied to the delay cells (111 to 11M) is increased, the delay time ($\Delta$) of each of the delay cells is decreased. Conversely, if the current supplied to the delay cells (111 to 11M) is decreased, the delay time ($\Delta$) of each of the delay cells is increased. Accordingly, the DLL (delay locked loop) circuit primarily uses a starved-current inverter type as the delay cells (111-11M). It is difficult to make a delay cell having less than a 50 picosecond delay time because a propagation delay time is about 50 picoseconds with the general semiconductor manufacturing process. The total power consumption in the DLL (delay locked loop) circuit is increased when "inner current" supplied to the delay cells is largely increased.

Therefore, the conventional DLL (delay locked loop) circuit is inappropriate for use as a multiphase clock generator in an optical driving system requiring high frequency operation at of 800 MHz or more.

A laser diode is used for "writing" data to an optical disc (e.g., a CD-R or a DVD-RW) and the laser diode power (LDP) signal (current) is alternated between a low level (space: logic 0) and a high level (mark: logic 1). Laser diode drivers (LDDs) are electrical-based devices that convert voltage into current, which the laser diode then converts into a light pulse to burn information onto an optical disc. The "high" ("write", "full") power level of the laser diode power signal (LDP) creates a "mark", and the "low"("erase") level creates a "space" on the optical disc. Unfortunately, the resolution of a CD player's optics is not sufficient to read directly a sequence of 1s or 0s following each other too closely, i.e. 111111. Another limitation is the maximum length of a given mark or space (pit or land), in order to leave room for the clock (synchronization) data. Therefore, it was agreed to keep at least two 0s between two 1s and, that the maximum length of marks (pits) was limited to 10 bits in a row. Because of how the laser of a CD-player detects ones and zeroes on the CD, there cannot be consecutive ones when storing the digital information. The solution for this problem is called eight-to-fourteen modulation (EFM). In the eight-to-fourteen conversion system each 8 user-bit byte is converted into a 14 channel-bit modulation code (EFM code). Thus, eight bit chunks of information are transformed to fourteen "channel" bits. Also, three merging bits of zeros are tacked on to each fourteen bit chunk.

EFM code marks and spaces are written on an optical media in nine different lengths, from T3 (1001) to T11 (100000000001). T for a "4×DVD" system is 9.56 nsec. The laser diode power (LDP) signal is modulated ON/OFF (e.g., as EFM code) that is to be written to the optical media by the laser diode. The first CD drives played back 75 blocks per second (176400 channel bits per second), which translated into the data transfer rate "1×" equal to about 0.15 MB/s.

FIG. 15 is a timing diagram of laser diode power (LDP) showing widening data grooves in a conventional optical driving system. In the case where the laser diode power (LDP) signal is held "ON" constantly at the fixed high level (e.g., a T11 mark: logic 1), the data groove width written to the optical disc can increase from a proper narrow width to an improper wide width. This is generally due to "thermal creep".

If the LD power (current through the laser diode) is held at a constant (fixed) high level, such as while writing a long "mark" (e.g., T11), a groove width written to the optical disc is increased to a wide width. Accordingly, the mark written in one data groove can become overlapped with data in an adjacent data groove, causing a data read error because adjacent data grooves are overlapping.

SUMMARY OF THE INVENTION

A first embodiment of the present invention provides a multiphase clock generator based on a delay locked loop (DLL) and comprised of delay cells, each delay cell having a delay time of: N×"a target delay time (Δ)"; where N is an odd integer greater than one, and the "target delay time (Δ)" may be T or a fraction of T (e.g., T/M, where M is the integer number of delay cells, and of multiphase clock signals (CLK<N> to CLK<MN>)). Therefore, the delay cells having a suitably small delay time e.g., (N×Δ) and power consumption are easily manufactured. The disclosed DLL (delay locked loop) based multiphase clock generator can operate at a higher frequency (e.g., M×f) with a lower power consumption than the conventional DLL (FIG. 1). Accordingly, an optical driving system including the DLL based multiphase clock generator circuit according to the present invention can also operate at 800 [MHz] or higher with reduced power consumption.

A second embodiment of the invention provides an optical driver circuit of an optical driving system and a method for implementing a write-strategy for preventing "overlapping" of marks written on adjacent grooves on an optical disc. The circuit and method can implement a high resolution pulse-write strategy, a block-write strategy, or a high-resolution hybrid-write strategy (combining features of the pulse-write and block-write strategies) as illustrated in FIG. 16. The optical driver circuit may include the above described multiphase clock generator (based on a delay locked loop (DLL) and comprised of delay cells, each delay cell having a delay time of: N×"a target delay time (Δ)") to produce write-strategy waveforms (channels) switching at a high resolution (e.g., T/32) in the Gigahertz range.

FIG. 16 illustrates a high-resolution hybrid-write strategy as well as the resulting pattern of dark and light areas (marks and spaces) on a recorded track of an optical disc. The hybrid-write strategy combines features of two methods: the pulse-write strategy or the block-write strategy.

With a pulse-write strategy, the optical driving system controls the laser diode power level by rapidly switching the laser from a high (e.g., full ON) to a low level. An initial longer pulse triggers just after the desired mark position has passed. This allows the natural forward heat "soak" to stay within the desired area. Similarly, sideways heat soak must be kept at a minimum to prevent interference with adjacent data grooves (tracks). The pulse exhibits a characteristic tail, which represents the rise time of the laser diode to full power and the heating of the material. After the initial pulse, very short pulses reduce the average power to the low "cool" level before the end of the desired mark—again to allow for thermal creep. Note that this method requires only three power levels: write, erase, and cool. The block-write strategy adds a fourth power level, "sustain," which maintains the temperature over long pulses without excessive thermal spread.

The hybrid-write strategy combines variable length pulses and multiple power levels (e.g., including the fourth power level, "sustain,") at a resolution greater than T/2. In the exemplary embodiments of the invention illustrated in FIGS. 6 through 14 and 17, the circuit and method implements a write strategy having a resolution of T/32. Higher-frequency embodiments of the invention may support even higher resolution "shaped-write strategies" that provide for digital (laser driver) circuits to generate high-resolution "shaped" waveforms that approximate and resemble analog signals instead of a series of "step" or "block" functions. A different shaped-write strategy could be tailored for each different length of mark (e.g., T3 through T11). The resulting pattern of dark and light areas (marks and spaces) recorded on a data groove of an optical disc would approach the "ideal" elongate shape for a mark, having effectively no (thermal) spread beyond of the bounds of its data groove.

In existing optical disc standards, the width of the land (the unused width between adjacent data grooves) is wider than the width of the data grooves themselves. Thus, the result of eliminating the spread of marks beyond the bounds of data grooves would in turn permit for the reduction of the distance (width of lands) between data grooves, or the interstitial insertion of a second track (data groove), to approximately double the data-carrying capacity of existing optical disc (e.g., DVD) media. Another result of precisely shaped (e.g., high-resolution) write strategies would be the conservation of energy needed to be output by the laser diode to write marks (and to read marks). This may allow lower-power, lower threshold-current, and less expensive, devices (e.g., laser diodes) to be used in the manufacture of optical storage disc drives according to embodiments of the invention.

Other embodiments of the invention provide a a multiphase clock generator, based on a DLL (delay locked loop), having low power consumption and a high frequency range.

Other embodiments of the invention provide an optical driving system including a DLL (delay locked loop) circuit having low power consumption and a high frequency range.

A DLL (delay locked loop) circuit is provided to generate multiphase clocks at the high frequency area by using N×(a target delay step (e.g., 50 psec) as a basic delay step.

The multiphase clock generator according to embodiments of the present invention comprises two delay chains receiving input clock signals having two different frequencies having a frequency ratio of N:1.

A first (main) delay chain operates at 1/Nth of the input clock frequency (f) and maintains a phase locked loop by sending UP or DOWN charge signals to a filter that outputs a control voltage based upon detecting a phase difference between an the f/N frequency clock and a DLL output clock.

A second (replica) delay chain operates at the input clock frequency (f) and outputs multiphase clocks (having M different phases) and receives the control voltage of the first (main) delay chain.

BRIEF DESCRIPTION OF THE DRAWINGS

The present invention will become understood by those of ordinary skill in the art by describing, in detail, exemplary embodiments thereof with reference to the attached drawings, wherein like elements are represented by like reference numerals, and which are provided for illustration only and thus do not limit the scope of the present invention.

DETAILED DESCRIPTION OF THE EXEMPLARY EMBODIMENTS

Figure 3:
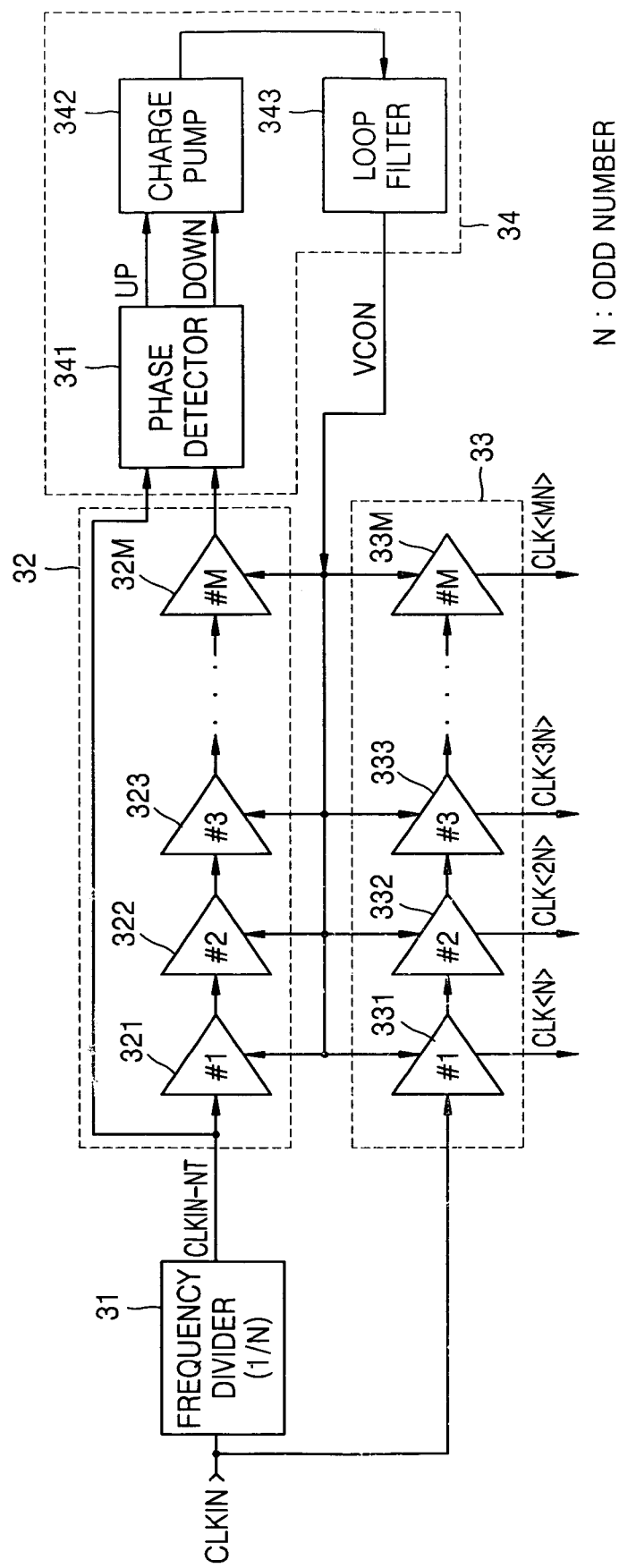
FIG. 3 is a circuit block diagram illustrating a multiphase clock generator, including a starved-current (voltage controlled) inverter type delay locked loop, DLL according to an embodiment of the present invention.
Figure 4:
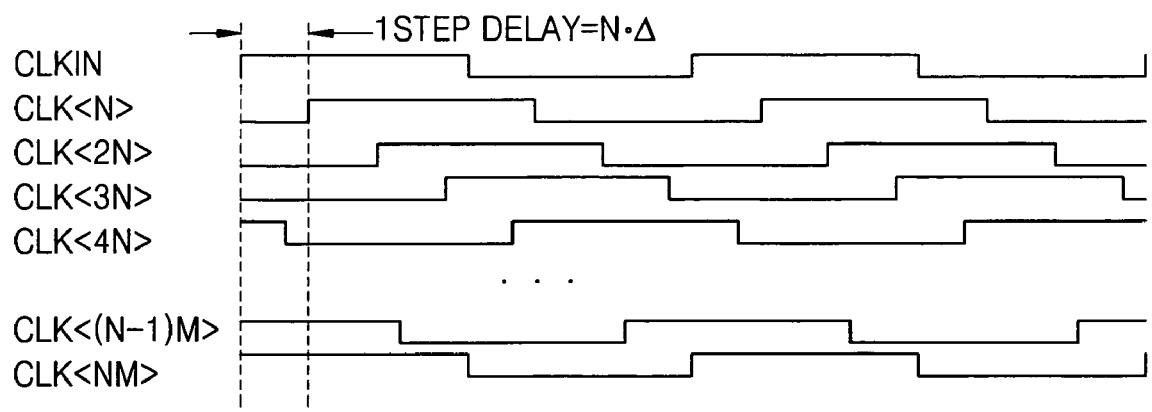
FIG. 4 is a timing diagram illustrating M multiphase clock signals generated by the multiphase clock generator of FIG. 3.

FIG. 3 is a circuit block diagram illustrating a DLL (delay locked loop) circuit according to an embodiment of the present invention. The DLL (delay locked loop) circuit of FIG. 3 will be explained in conjunction with FIGS. 4, and 5 which are a timing diagrams illustrating a number M of clock signals generated by the DLL circuit of FIG. 3. (e.g., when an input clock signal CLKIN frequency is 800 MHz, N=3 and M=32).

The multiphase clock generator based on a DLL (delay locked loop) circuit of FIG. 3 has a frequency divider (31), a first (main) delay chain (32), a second (replica) delay chain (33) and a control circuit (34) and a line transmitting a control voltage (VCON). The feedback loop formed by the first (main) delay chain (32), and the control circuit (34) and the control voltage (VCON), form a conventional DLL (delay locked loop) locked to the divided clock signal (CLKIN-NT, having a frequency f/N and period N×T) output by the frequency divider (31). The multiphase clock generator (DLL circuit) of FIG. 3 additionally comprises a frequency divider (31) (supplying a divided input clock signal CLKIN-NT to the main delay chain), and a second (replica) delay chain operatively connected to the (line transmitting the) control voltage (VCON) for delaying the undivided input clock signal CLKIN.

The frequency divider (31) divides the (frequency f of the) input clock signal (CLKIN, having frequency f and period T) by N (e.g., N is an odd integer greater than one) to output the divided clock signal (CLKIN-NT, having a frequency f/N and period N×T).

The main delay chain (32) includes M (M is an integer) delay cells (321 to 32M).

The main delay chain (32) operates at the frequency f/N (f is the frequency of the input clock signal CLKIN) receiving the clock signal (CLKIN-NT) output from the frequency divider (31), and delays the frequency divider output clock signal (CLKIN-NT) according to a control voltage (VCON).

Figure 1:
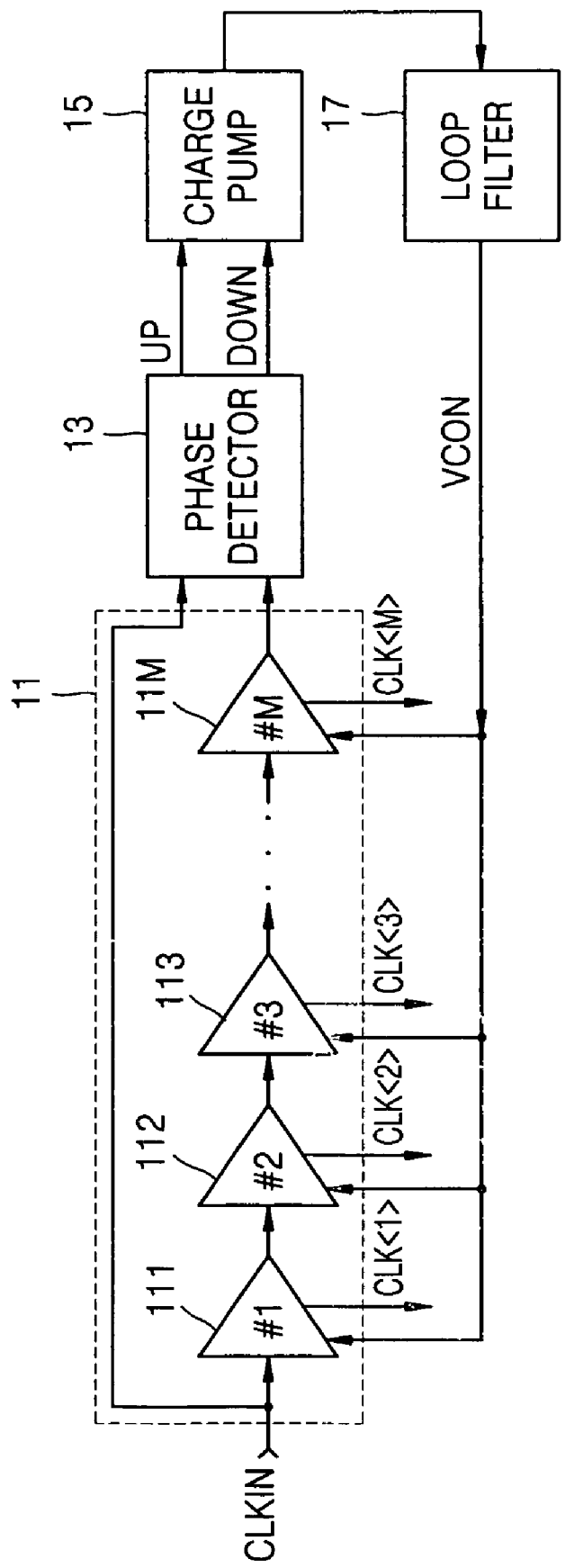
FIG. 1 is a circuit block diagram illustrating a conventional starved-current (voltage controlled) inverter type DLL (delay locked loop) used as a multiphase clock generator.
Figure 2:
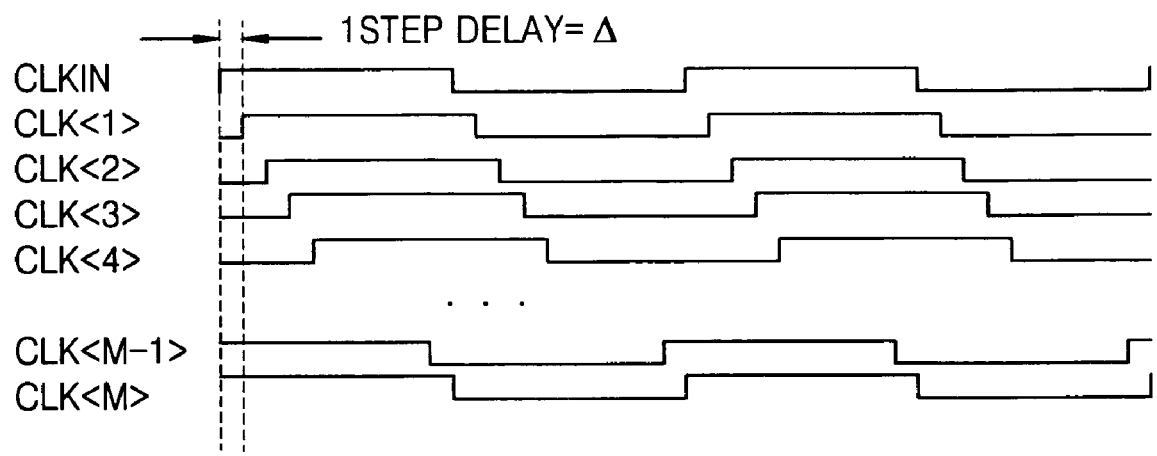
FIG. 2 is a timing diagram illustrating M multiphase clock signals generated by the DLL of FIG. 1.

The main delay chain (32) performs a phase-locking operation with a control circuit (34) in the DLL feedback loop. The control circuit (34) has a phase detector (341), a charge pump (342) and a loop filter (343) that each functions like its counterpart in the conventional DLL of FIG. 1. The phase detector (341) generates UP/DOWN signals corresponding to the phase difference between the frequency divider output clock signal (CLKIN-NT) and the output clock signal of the main delay chain (32). The charge pump (342) sources/sinks a prescribed current to an output unit according to the UP/DOWN signals. The loop filter (343) generates the control voltage (VCON) by filtering the output of the charge pump (342).

The replica delay chain (33) includes M delay cells (non-inverting buffers, 331 to 33M) serially connected to each other. The replica delay chain (33) receives the (undivided) input clock signal (CLKIN) and generates from it a number M of clock signals (CLK<N> to CLK<MN>) having different phases, by delaying the input clock signal (CLKIN) according to the control voltage (VCON).

The "step" delay time of each of the delay cells (non-inverting buffers: 321 to 32M and 331 to 33M) in the main delay chain (32) and in the replica delay chain (33) according to the present invention is N×Δ (where N is an integer; and Δ is a "target delay time") for generating the target delay corresponded to a minimum phase difference between the plural (M) delayed clock signals. The target delay time (Δ) is T/M (where T is the period of input clock signal (CLKIN)) because it corresponds to a minimum phase difference between a number of M clock signals (CLK<N> to CLK<MN>). Thus, each of the main delay chain (32) and the replica delay chain (33) is comprised of delay cells (321 to 32M, and 331 to 33M respectively) each having a delay time of N×ΔΔ (where Δ=T/M).

The following description explains why two delay chains, the main delay chain (32) and the replica delay chain (33), instead of only one delay chain as used in the conventional DLL, are preferably used in DLL-based multiphase clock generators according to an embodiment of the present invention.

The replica delay chain (33) includes M delay cells each having a delay time of N×Δ (=N×T/M=1 step delay). Therefore, the total delay time of the replica delay chain (33) becomes N×T (which is longer than the period T of the input clock signal (CLKIN)).

Accordingly, it is difficult to detect a phase error between the input clock signal (CLKIN) and a final output clock signal of the replica delay chain (33) by using only the replica delay chain (33), due to its including M delay cells each having the delay time of N×Δ. Therefore, the main delay chain (32) is separately used for making a phase locking loop (by detecting the phase error the input clock signal (CLKIN) and a final output clock signal of the replica delay chain (33)). The frequency divider output clock signal (CLKIN-NT) having period N×T is inputted into (a first delay cell 321 of) the main delay chain (32). The control circuit (34) generates a control voltage (VCON) in response to phase difference between the frequency divider output clock signal (CLKIN-NT) and the output clock signal of the main delay chain (32) (output by the last delay cell 32M). The control voltage (VCON) is fed back to (a second input of) the main delay chain (32) and to (a second input of) the replica delay chain (33).

Figure 5:
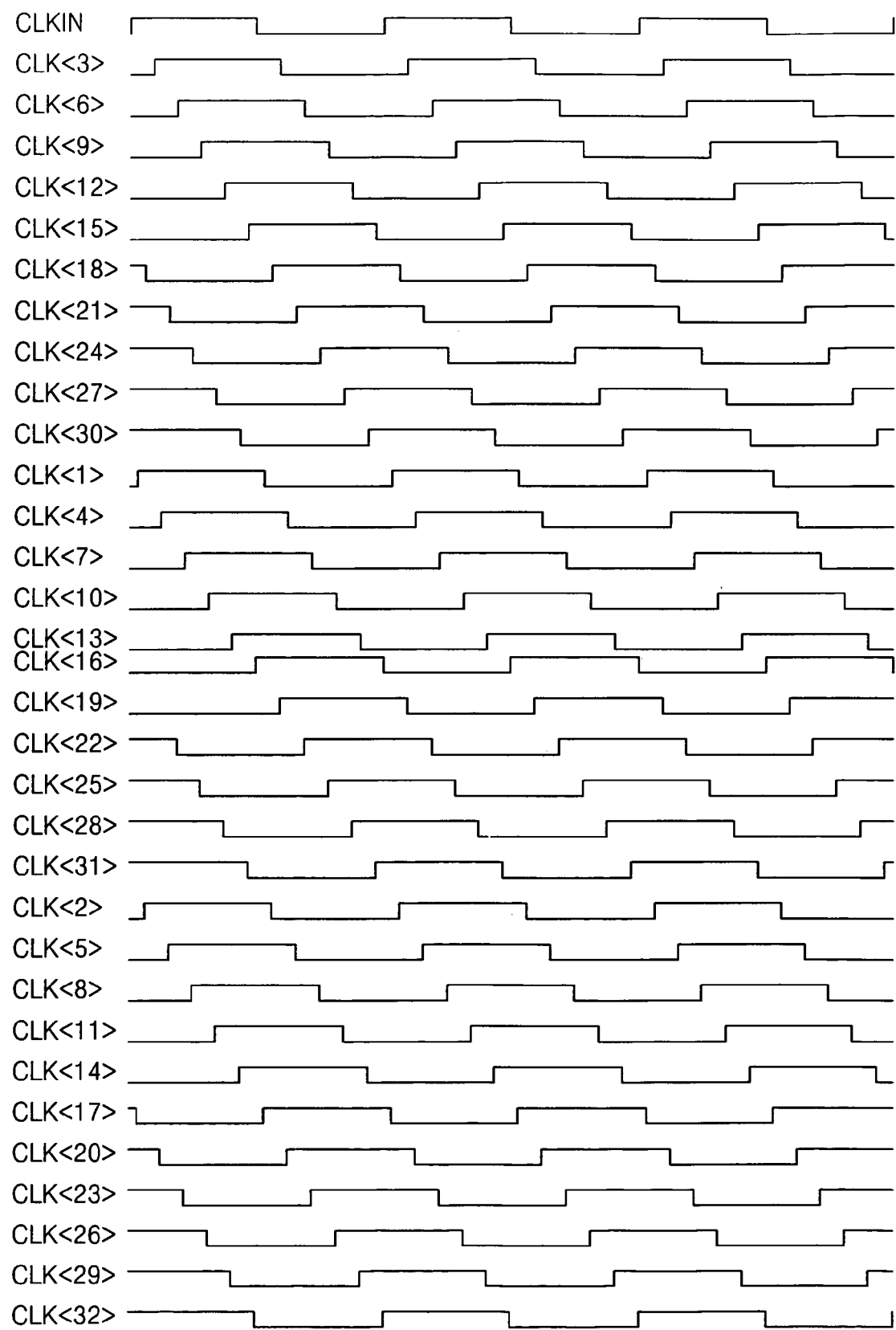
FIG. 5 is a timing diagram illustrating M clock signals generated from the multiphase clock generator of FIG. 3 when N=3 and M=32.

FIG. 5 is a timing diagram illustrating a number (M=32) of clock signals (e.g., CLK<3>, CLK<6>, . . . , CLK<32>) generated from the delay cells 331 to 33M respectively of the multiphase clock generator (DLL circuit) of FIG. 3 when an input clock signal (CLKIN) frequency is 800 MHz, N=3 and M=32. In this case, a delay time (3Δ) through each one of the delay cells (321 to 32M; and 331 to 33M) respectively is 117.18 psec (3×Δ=3×(39.06×10$^{-12}$) seconds=3×1/(800× 10$^{6}$×32) seconds).

As shown in FIG. 3 and FIG. 5, the first delay cell (331) in the replica delay chain (33) generates CLK<3> with delay time of 3Δ delayed relative to the CLKIN; and the second delay cell (332) in the replica delay cell (33) generates CLK<6> with delay time of 3Δ delayed relative to CLK<3>. In this manner, a number of clock signals having delay time of 3Δ with respect to the output of each previous delay cell are generated, without overlapping with each other, passing through one delay cell after another. The last clock signal (e.g., CLK<32>, where M=32) is generated from clock signal (CLKIN) after passing (CLKIN) through the last delay cell <33M> of the replica delay chain (33). Thus, a plurality M of clock signals with M (e.g., M=32) different phases are generated. When the plurality M of clock signals are arranged in order of real time occurrence (e.g., CLK<1>, then CLK<2>, then CLK<3>, then CLK<M-1>, and finally CLK<M>), a delay equal to the "target delay time" Δ is established between them. Accordingly, multiphase clock signals with a target delay time Δ between them can be easily generated by using a plurality of delay cells having delay time of N×Δ (e.g., 3×Δ).

As previously noted, the conventional multiphase clock generator (consisting entirely of a delay locked loop), uses M delay cells each having the "step" delay time of Δ (Δ=T/M, where T is the input clock signal period) for generating M clock signals (CLK<1> to CLK<M>) having M different phases, separated by T/M, synchronized to the input clock signal (CLKIN). By contrast, the multiphase clock generator of FIG. 3 according to the present invention uses M delay cells (operatively connected to delay locked loop) each having a "step" delay time of N×Δ (=N×T/M) for generating M clock signals (CLK<1> to CLK<M>) having M different phases separated by T/M, synchronized to the input clock signal (CLKIN). Accordingly, the multiphase clock generator of FIG. 3 according to the present invention can be easily manufactured and has lower power consumption (because the DLL circuit in FIG. 3 can be made using delay cells having larger "step" delay time margins as compared to the conventional multiphase clock generator (DLL) type of FIG. 1. Thus the multiphase clock generator of FIG. 3 can operate at higher frequency, while using the same manufacturing process as the conventional DLL of FIG. 1. The multiphase clock generator of FIG. 3 can also be used in an optical (disc) driving system requiring high frequency operation (e.g., 800 MHz).

Figure 6:
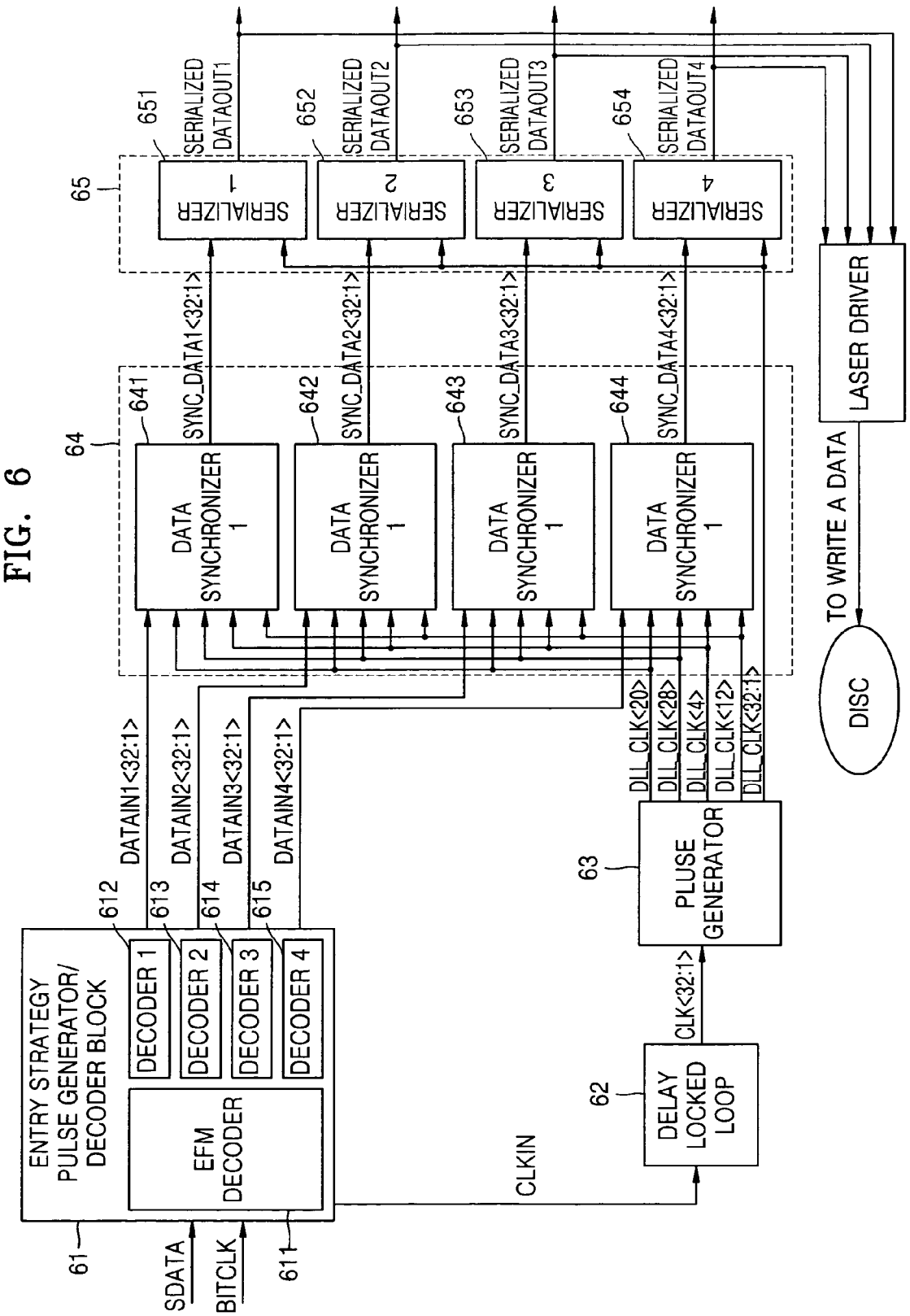
FIG. 6 is a circuit block diagram illustrating a multi-standard format optical (disc) drive system including the multiphase clock generator of FIG. 3, according to a second embodiment of the present invention.

FIG. 6 illustrates an exemplary multi-standard format optical (disc) drive system in accordance with a second embodiment of the present invention. The optical driving system of FIG. 6 includes the high-frequency multiphase clock generator (e.g., of FIG. 3) and implements a write strategy method for writing data to an optical disc such as a CD, DVD, DVD-RW, DVD-RAM etc., without overlapping marks.

The multi-standard format optical (disc) driving system of FIG. 6, includes a write strategy generator (61), a DLL (delay locked loop) circuit (62), a pulse generator (63), four data synchronizers (641 to 644 in data synchronizer unit 64), a four serializers (651 to 654, in serializer unit 65). In alternative embodiments of the invention, (e.g., wherein the system uses more than four bias channels), the multi-standard format optical (disc) driving system may include G data synchronizers (641 to 64G) in data synchronizer unit 64), and G serializers (651 to 65G), in serializer unit 65, wherein G is an integer indicating the number of channels and the number of groups of lines write strategy data and of (synchronizer and serializer) circuits. G equals the number of bias levels of laser diode power (LDP) to be applied to the optical storage medium. In the diagrams (e.g., FIGS. 6 and 7) herein showing the exemplary embodiments, G equals 4.

Figure 7:
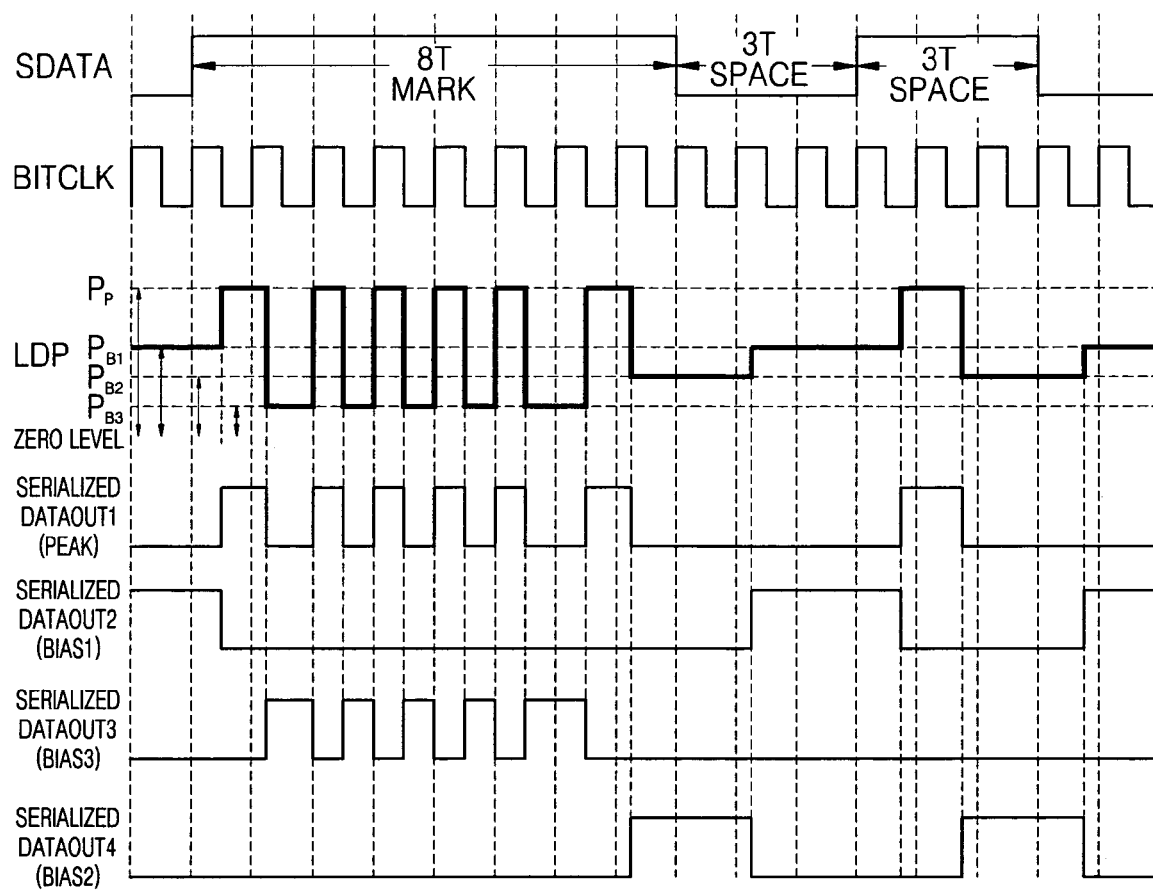
FIG. 7 is a timing diagram illustrating input/output signals of the multi-standard format optical (disc) drive system of FIG. 6.
Figure 14:
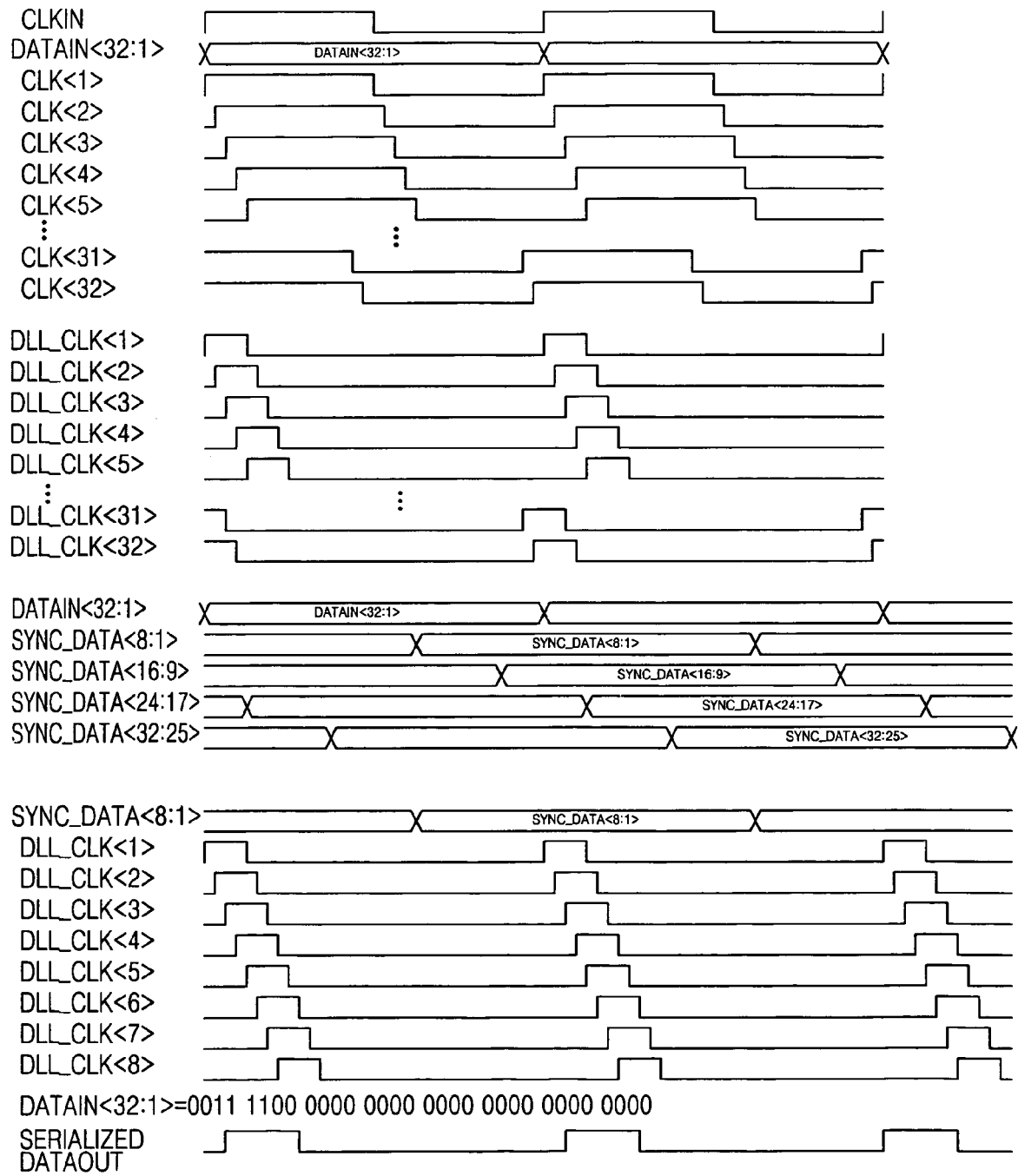
FIG. 14 is a timing diagram illustrating the operation the optical driving system of FIG. 6.
Figure 15:
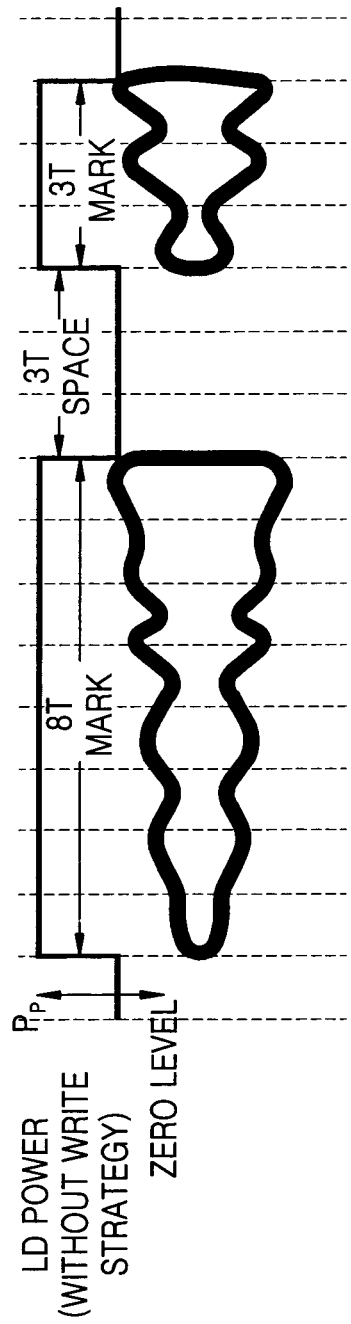
FIG. 15 is a timing diagram of an alternating laser power level resulting in widening data grooves in a conventional optical driving system.
Figure 16:
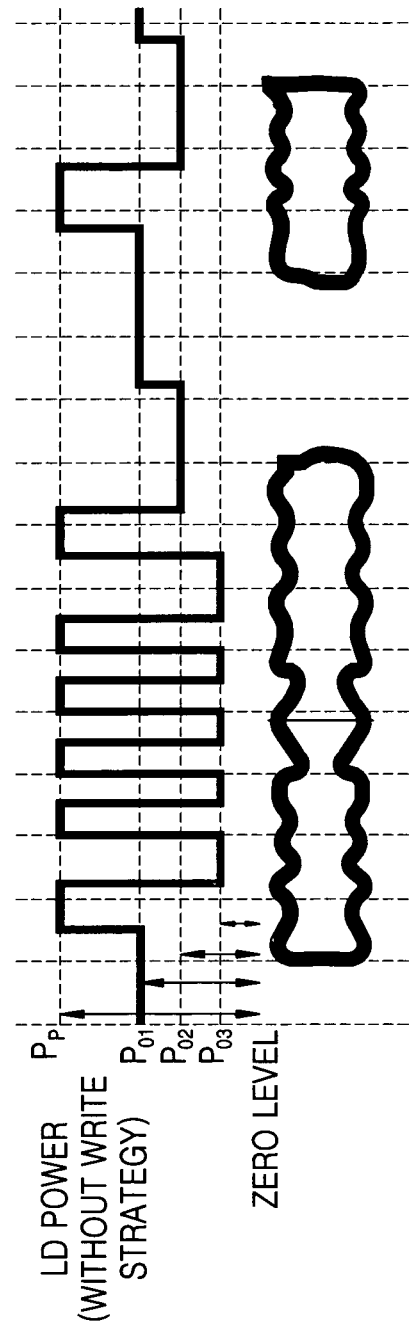
FIG. 16 is a timing diagram illustrating a high-resolution hybrid-write strategy and the resulting pattern of marks and spaces on an optical disc.

FIG. 14 illustrates a timing diagram illustrating the operation of the optical driving system operation of FIG. 6. The Laser diode power (LDP) level is controlled with 4 bias levels, (Peak, Bias1, Bias2, Bias3), as shown in FIGS. 6 and 7. Thus, the exemplary optical drive system of FIG. 6, for writing a modulated data (e.g., EFM modulated data for CDs, and EFM+modulated data for DVDs) to an optical disc, needs four (G=4) laser power output channels, each having a binary (ON/OFF) operation, for controlling the four bias levels (Peak, Bias1, Bias2, Bias3) of the LD power (LDP) signal (see FIG. 7). Thus, the multi-standard format optical drive system of FIG. 6 provides 4 channels for supplying laser diode power (LDP current). FIG. 7 is a timing diagram illustrating input/output signals of the multi-standard format optical (disc) drive system of FIG. 6.

The 4 laser control signals are the final outputs (Serialized DATAOUT1, Serialized DATAOUT2, Serialized DATAOUT3, Serialized DATAOUT4) of the optical drive system.

The write strategy generator (61) outputs, in each of four channels, a plurality M (e.g., M=32) of bits of write strategy data (DATAIN1<32:1>, DATAIN2<32:1>, DATAIN3<32: 1>and DATAIN4<32:1>) per each period T of the Bit Clock (BITCLK) upon receiving/decoding a serial modulated (.e.g., EFM, Eight to Fourteen modulation) data (SDATA) and a bit clock (BITCLK) from an EFM encoder (not shown). The four channels of write strategy data correspond to four channels of laser diode current to be combined through the laser diode.

The write strategy generator (61) further includes a conventional modulated data decoder (611) (e.g., an EFM decoder of the related art) and four channel decoders (612 to 615). The modulated data (e.g., EFM) decoder (611) decodes a serial (EFM) data (SDATA) and a bit clock signal (BIT-CLK) according to the mode of operation by determining both mark length and space length of the laser diode power signal (LDP) (e.g., see FIG. 7) after receiving the serial (EFM) data (SDATA) and the bit clock signal (BITCLK). The (EFM) modulated data decoder 611 generates write strategy information by detecting mark/space length according to operation mode, after receiving a serial EFM data (SDATA) and BITCLOCK from an encoder (EFM not shown). The decoded write strategy information may be converted into four channels of write strategy data, by the four channel decoders (612 to 615), using a LUT (look-up table), indexed by mark/space length, stored in a RAM or a register. If there is supplied a nominal value of the first/last pulse edge through a register, the delay time may be added/subtracted from the nominal value stored in the LUT.

In FIG. 7, the laser diode power signal (LDP) comprises a peak level (PP), a bias level1 (PB1), a bias level2 (PB2) and a bias level3 (PB3). The 4 bias level control signals are needed for making a wanted LDP signal by being the bias levels On/Off. The output data (serialized DATAOUT1 to serialized DATAOUT4) generated from the optical driving system according to the present invention corresponds to the 4 bias level control signals.

The four laser power currents, controlled by the four channels, may be summed at the output of the laser (diode) driver LD. The laser diode power signal (LDP) may be modulated, based on the combination of the four channels of bias current (i.e., the serialized dataout), as shown in FIG. 7, when writing EFM code marks to an optical disc data using a laser diode. Thus, the optical (disc) driving system of FIG. 6 may flexibly implement write strategies having a resolution of T/32 for different optical disc formats (e.g., CD-R, DVD-R, DVD-RW).

The multiphase clock generator (62) (e.g., the multiphase clock generator of FIG. 3) receives an input clock signal (CLKIN) and generates from it a plurality M (e.g., M=32) of clock signals (CLK<32:1>, meaning CLK<1> through CLK<32>) having a plurality M (e.g., M=32) of different phases.

The pulse generator (63) receives the M clock signals (CLK<32:1>) generates from them respectively M pulse signals (DLL_CLK<32:1>) corresponded to every rising edge of the 32 clock signals (CLK<32:1>), respectively. See FIG. 9 for the shape and sequence of the pulse signals (e.g., DLL_CLK<1>, DLL_CLK<2>, . . . DLL_CLK<32>)

The data synchronizer unit 64, comprised of four data synchronizers (641 to 644), outputs the synchronized write-strategy data by sequentially synchronizing to a selection of four (equally separated) pulse signals (e.g., DLL_CLK<20>, DLL_CLK<28>, DLL_CLK<4>, DLL_CLK<12>) among the 32 pulse signals, after receiving 32 bit data (DATAIN1<32:1> to DATAIN4<32:1>).

The serializer unit 65, comprised of four serializers (651 to 654) corresponding to the four channels, outputs four channels of serialized data (Serialized DATAOUT1, Serialized DATAOUT2, Serialized DATAOUT3, Serialized DATAOUT4) after sampling the synchronized data (SYNC_DATA1<32:1>to DATAIN4<32:1>) from the four synchronizers (641 to 644) corresponding to the 32 pulse signals (DLL_CLK<32:1>).

Figure 8:
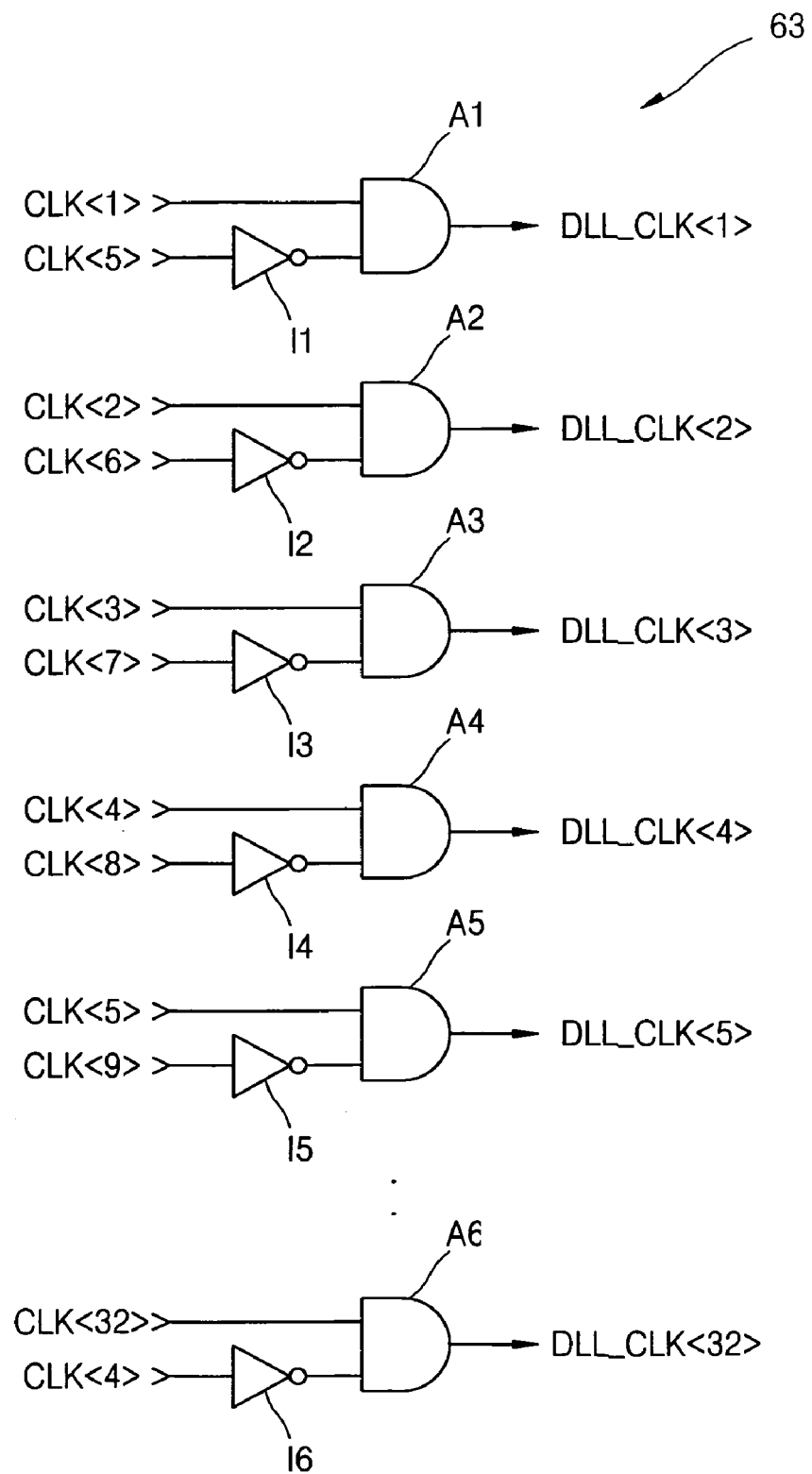
FIG. 8 is a detailed circuit diagram illustrating the pulse generator in FIG. 6.
Figure 9:
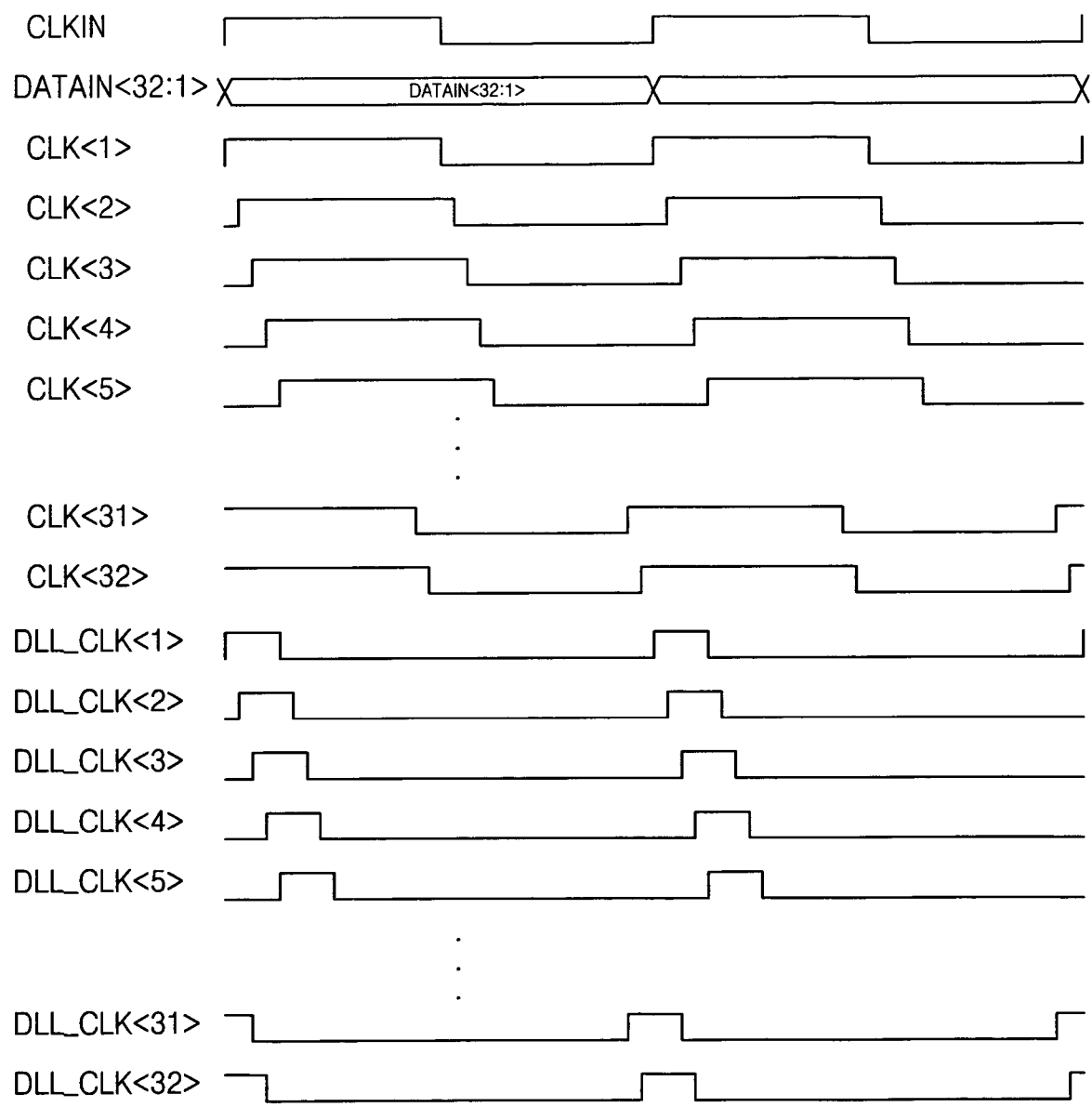
FIG. 9 is a timing diagram illustrating the operation of the pulse generator of FIG. 8.

FIG. 8 is a detailed circuit diagram illustrating the pulse generator (63) in FIG. 6; FIG. 9 is a timing diagram illustrating the operation of the pulse generator (63).

In FIG. 8, the pulse generator (63) comprises a plurality (e.g., M=32) of AND-gates (e.g., A1 to A6) and a plurality (e.g., M=32) of inverters (e.g., I1 to I6). The pulse signals (DLL_CLK<32:1>) output by the pulse generator (63) correspond to the rising edges of the M multiphase clock signals (CLK<32:1>). Each of the AND-gates generates a pulse by ANDing a first clock signal and an inverted second (subsequent) clock signal. The inverted second (subsequent) clock signals are output by the plurality M of inverters (e.g., I1 to I6), For example, AND-gate (A1) generates a pulse signal (DLL_CLK<1>) by AND-ing both a first clock signal (CLK<1>) and an inverted second clock signal (CLK<5>) output by inverter (I1). The inverter (I1) inverts the second clock signal (CLK<5>). In this manner, a predetermined number of pulse signals (DLL_CLK<32:1>) of predetermined periods (pulse lengths) are output from the AND gates (A1 to A6).

Figure 10:
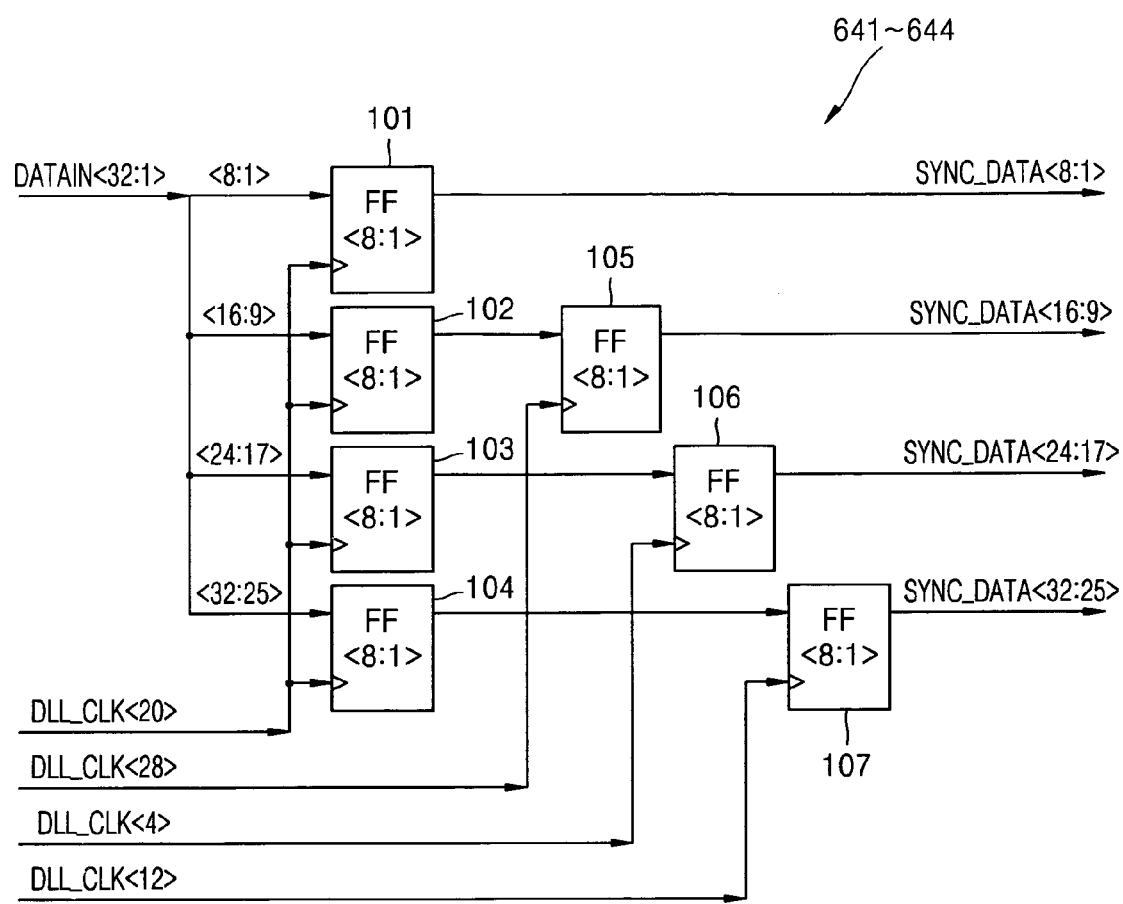
FIG. 10 is a detailed circuit diagram illustrating a data synchronizer in FIG. 6.
Figure 11:
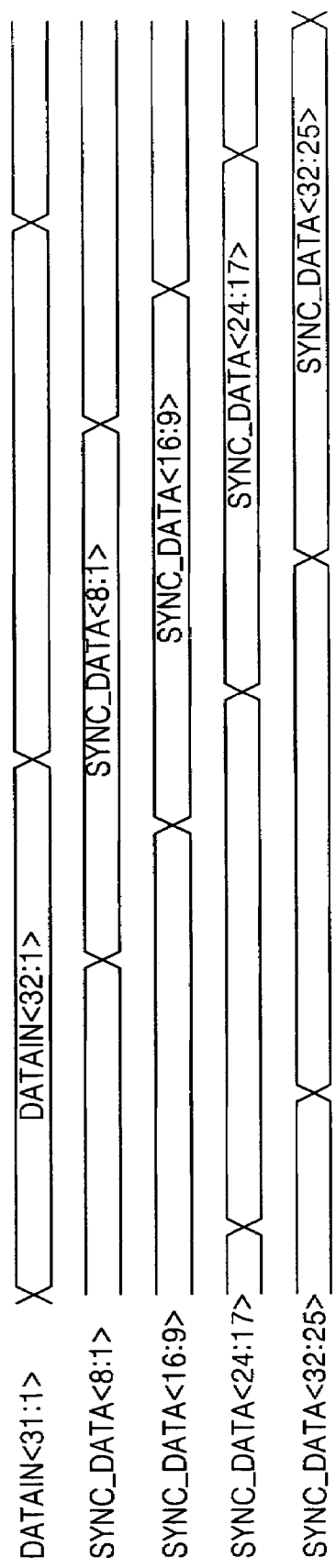
FIG. 11 is a timing diagram illustrating the operation of the data synchronizer of FIG. 10.

FIG. 10 is a detailed circuit diagram illustrating a data synchronizer unit (64) in FIG. 6. FIG. 11 is a timing diagram illustrating the operation of the data synchronizer unit 64 of FIG. 10.

The data synchronizer unit 64 (comprising synchronizers 641 to 644) includes a number (2L-1) of Flip-Flops blocks (101 to 107) and each Flip Flop block includes a plurality M/L (e.g., 8) Flip-Flops. L represents the number of sets of bits to be output in parallel per channel. As shown in FIG. 11, the 32 bits (per T)_of write strategy data (DATAIN<32:1 >) is latched by every 8 bits and is outputted in parallel as synchronized data (SYNC_DATA1<8:1>, SYNC_DATA2<16:9>, SYNC_DATA3<24:17>, SYNC_DATA4<32:25>) as shown in the timing diagram of FIG. 11.

Figure 12:
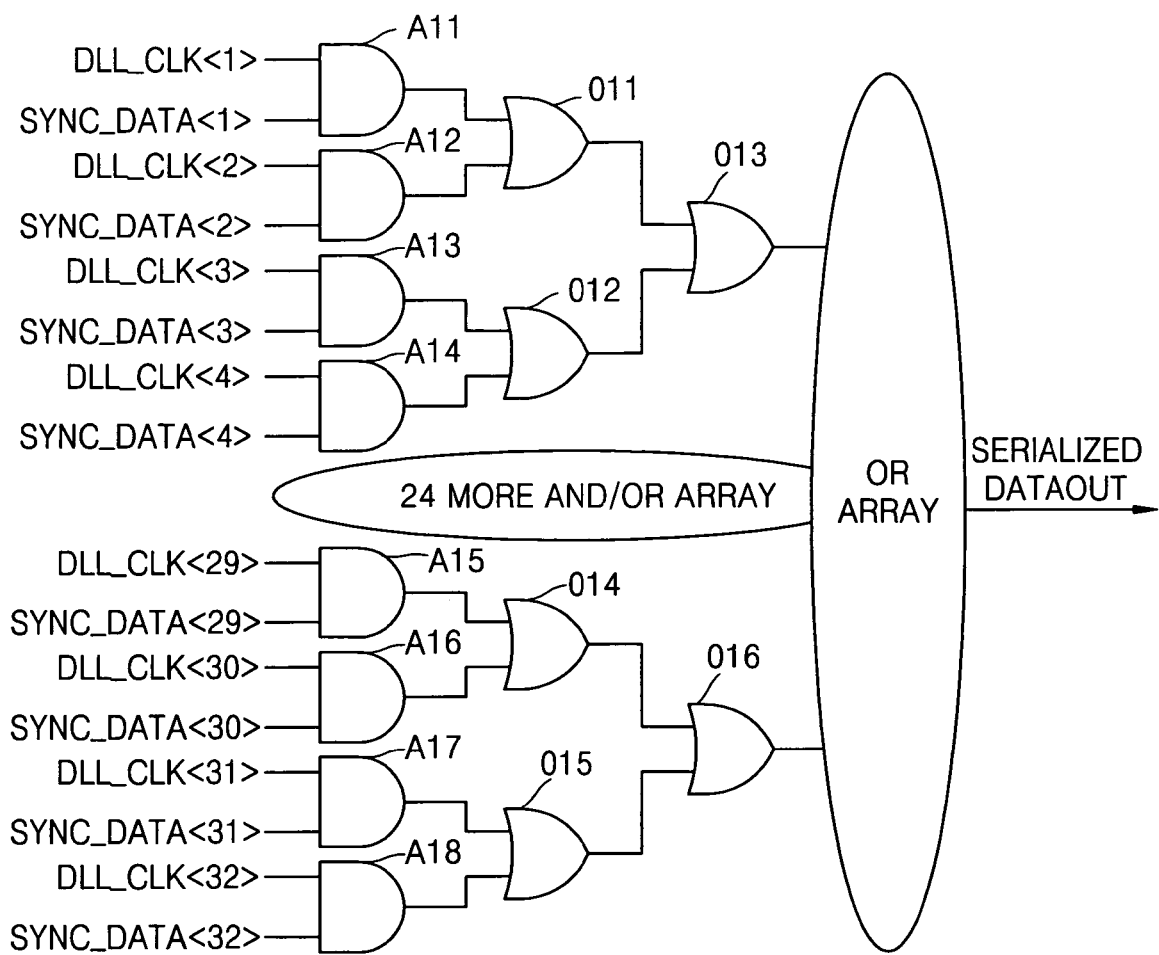
FIG. 12 is a detailed circuit diagram illustrating a serializer circuit in FIG. 6.
Figure 13:
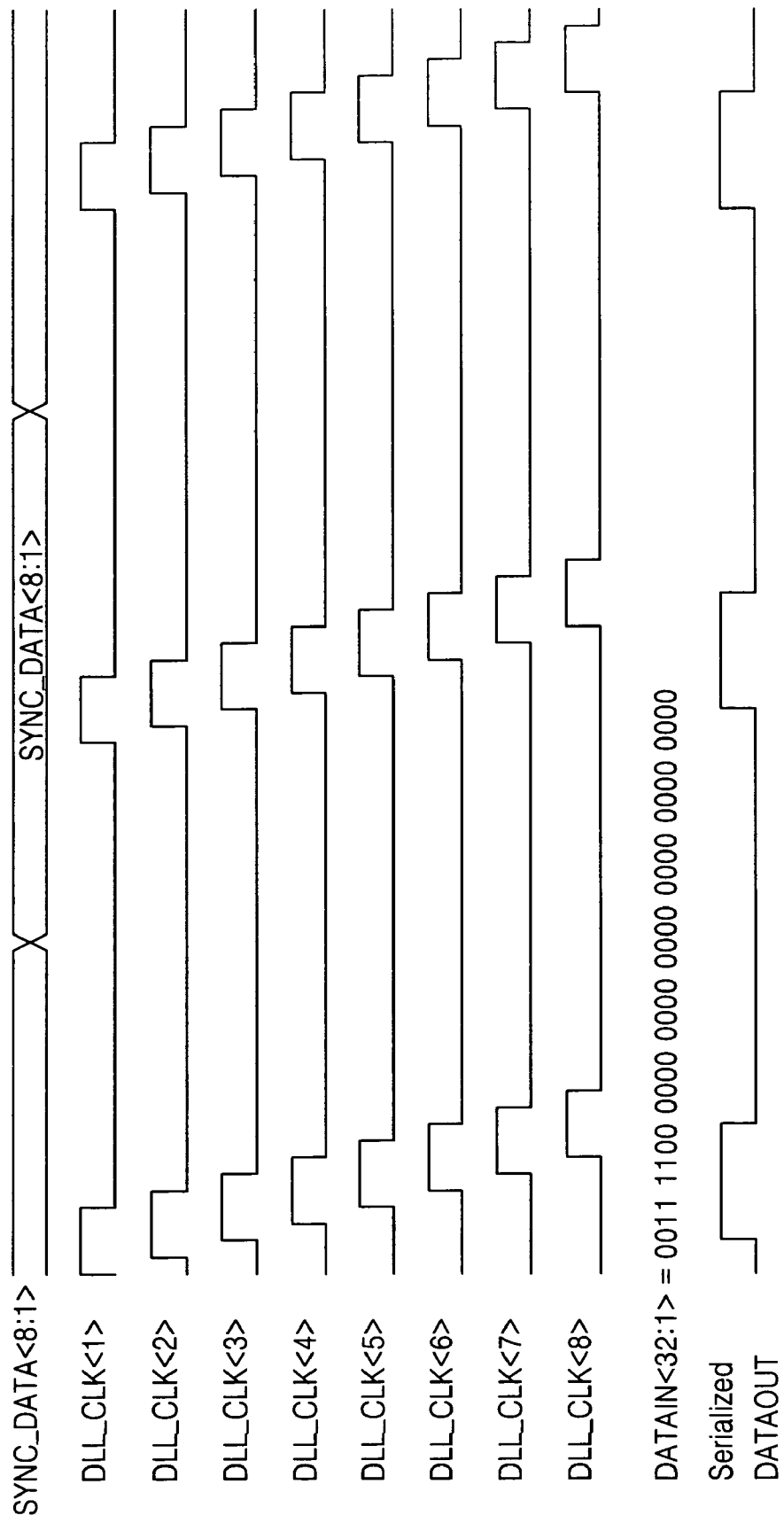
FIG. 13 is a timing diagram illustrating the operation of the serializer circuit in FIG. 12.

FIG. 12 is a detailed circuit diagram illustrating a serializer circuit (e.g., Serializer 1) in FIG. 6. FIG. 13 is a timing diagram illustrating the operation of the serializer circuit in FIG. 12.

The serializer circuit comprises a plurality M of AND-gates (e.g., A11 to A18) and a number of operatively connected cascade of OR-gates (e.g., O11 to O16). Each of the AND-gates (e.g., A11) combines one (latched) bit of write strategy data (e.g., SYNC_DATA1<1>output by the data synchronizer unit 64), and a pulse (e.g., DLL_CLK<l>output by the pulse generator 63). Thus, at any one time, during the active period of a given pulse (e.g., DLL_CLK<1>) one corresponding bit of write strategy data is sampled and output by the cascade of OR-gates as the SERIALIZED DATAOUT. Thus, the SERIALIZED DATAOUT output of each serializer (e.g., 651) is a sequence of binary values that represent one (bias) channel of write strategy data, for controlling the laser diode power (LDP).

As illustrated in FIG. 13, the synchronized data (SYNC_DATA<32:1>) output by to the data synchronizer (641 to 644) to the serializers (651 to 654) is in turn outputted as the serialized output data (serialized DATAOUT) after being sequentially sampled in response to the pulse signals (DLL_CLK<32:1>).

The data synchronizer (641 to 644) and the serializers (651 to 654) thus operate together as variable delay elements for synchronizing four channels of write strategy data.

Figure 17:
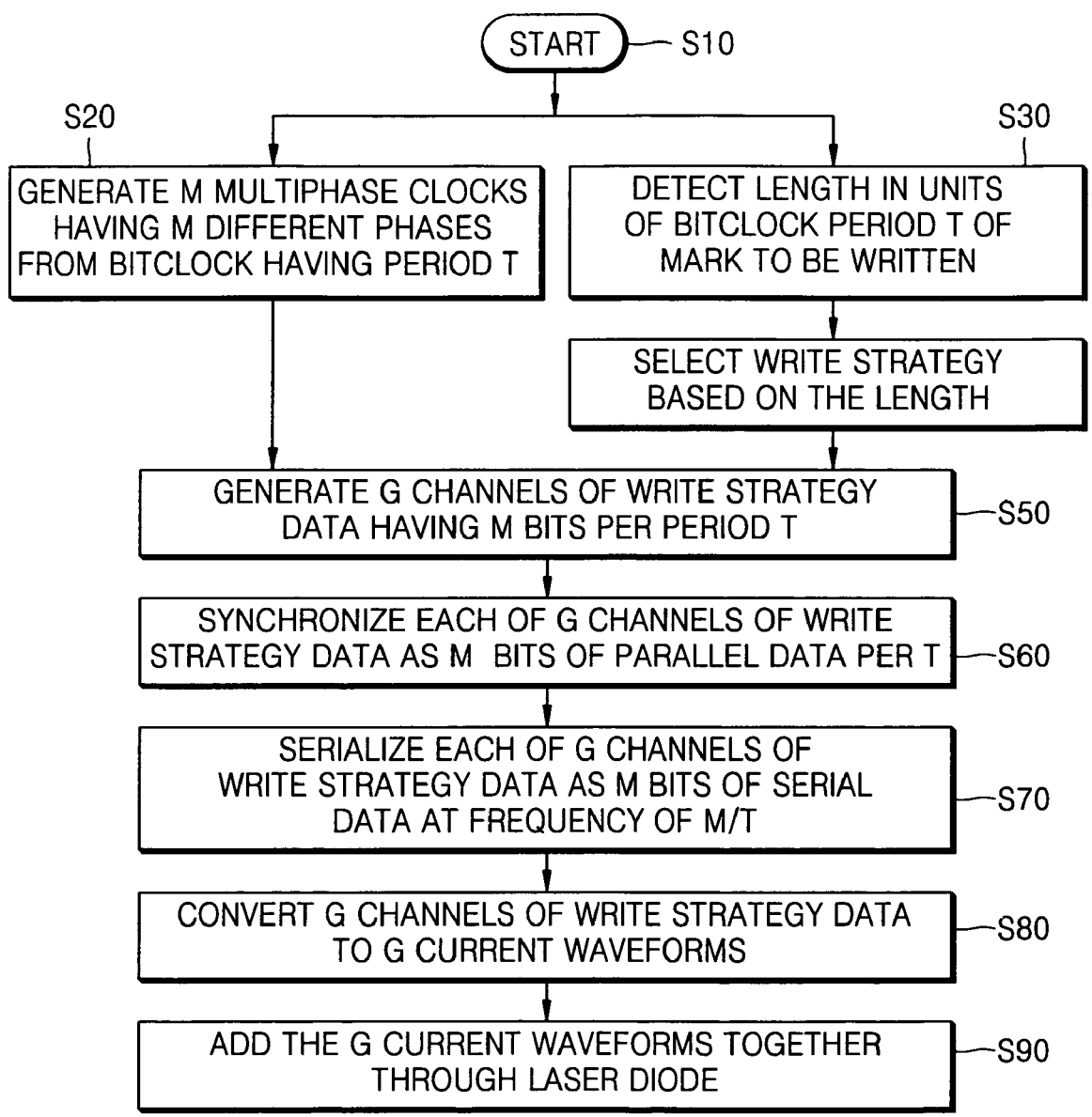
FIG. 17 is a flow chart illustrating a general method of modulating a write current through a laser diode based upon the length of a mark to be written, according to an embodiment of the present invention.

FIG. 17 is a flow chart illustrating an examplary method of modulating a write current through a laser diode based upon the length of a mark to be written, according to an embodiment of the present invention. Following a start at step S10 at which time a BitClock (see FIG. 6) having frequency f and period T (f=1/T) is received together with EFM code marks to be written. Then two steps are performed in parallel, step S20 and step S30.

In step S20, M multiphase clocks having M different phases are generated from (in synchronization with) the BitClock having period T and frequency f (f=1/T). M may be equal to or greater than 2 (e.g., M=32 as shown in FIGS. 3, 6) In parallel step S30, the length, in units of bitclock period T, of the mark to be written to an optical (disc) media is measured (detected, determined). The detected length of the mark is then a basis of the selection of a write strategy for writing that mark on the optical (disc) media, in step S40.

In step S50, G (e.g., G=4 as shown in FIG. 6) channels of write strategy data having M bits per period T are generated (e.g., in parallel). This step may be performed by the four Decoders (612 through 615) in Decoder block 61 of FIG. 6, where equals 4. Then, in step S60, each one of the G (e.g., G=4 as shown in FIG. 6) channels of write strategy data are synchronized as M bits of parallel data per period T. (e.g., by sample-and-hold latches 101 to 107, in each synchronizer in the synchronizer block 64 in FIGS. 6 and 10). Next, in step S70, each one of the G (e.g., G=4 as shown in FIG. 6) channels of parallel (synchronized) write strategy data are serialized as M bits of serial data per period T. (e.g., at a pulse frequency of M×f=M/T). This step may be performed by the clocked (AND) gates in the serializer block 65 of FIGS. 6 and 12.

In step S80, each of the each one of the G channels of serialized bits of write strategy data are converted into a write-current (a write-current waveform) (e.g., to control a bias current of a laser diode). And finally, in step S90, the G write currents are combined (into one pulse-width and current-amplitude modulated write current) and conducted through a laser diode, which emits write-strategy modulated light to burn the mark onto the optical (disc) media.

Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed. In the following claims, G, L, M, and N are integers.

What is claimed is:

1. An optical driver circuit, comprising:
a decoder for translating modulated data into bits of write strategy data for controlling of laser power to be applied to an optical storage medium, and outputting write strategy data in M bits per period T;
a multiphase clock generator for receiving an input clock signal having period T and generating therefrom M clocks having M different phases;
a data synchronizer for synchronizing the write strategy data using the M clocks; and
a serializer for serially outputting the synchronized write strategy data for modulating laser power to be applied to the optical storage medium.

2. The optical driver circuit of claim 1, wherein the multiphase clock generator is a delay locked loop (DLL) circuit having a first set of M delay cells in a delay locked loop, each delay cell having a step delay of N×D, and a second set of M delay cells, each delay cell having a step delay of N×D, operatively connected to the delay locked loop, for outputting the M clocks having M phases.

3. The optical driver circuit of claim 2, wherein the first set of M delay cells are disposed in the feedback loop of the delay locked loop.

4. The optical driver circuit of claim 2, wherein the second set of M delay cells are disposed outside of the feedback loop of the delay locked loop.

5. The optical driver circuit of claim 2, wherein N is an odd number and D is the phase period between the M clocks.

6. The optical driver circuit of claim 1, wherein the decoder outputs the decoded data in G groups, G being equal to a number of bias levels of power to be applied to the optical storage medium.

7. The optical driver circuit of claim 1, wherein the synchronizer includes G groups of latches, G being equal to a number of bias levels of power to be applied to the optical storage medium.

8. The optical driver circuit of claim 7, wherein each latch is clocked by a corresponding one of the M clocks.

9. The optical driver circuit of claim 1, wherein the serializer includes M gates for receiving the M synchronized decoded data, each of the M gates also receives a corresponding one of the M clocks to perform a logical operation.

10. The optical driver circuit of claim 9, wherein the M gates are divided into G groups, each group having a plurality of logical gates, G being equal to a number of bias levels of power to be applied to the optical storage medium.

11. The optical driver circuit of claim 1, wherein the serializer includes a G-input logical OR gate for combining the outputs of the G groups of logical gates.

12. A driver circuit comprising:
a multiphase clock generator, for outputting M clocks having M different phases;
a decoder for decoding modulated data representing designation of values of power to be applied to an optical storage medium, and outputting decoded data in M bits;
a data synchronizer for synchronizing the decoded data in M bits corresponding with said M clocks having M different phases; and
a serializer for serially combining the synchronized decoded data and outputting drive data representing modified designations of values of power to be applied to an optical storage medium.

13. The circuit of claim 12, wherein the decoder outputs the decoded data in G groups.

14. The circuit of claim 12, wherein the synchronizer includes G groups of latches, G being equal to the number of bias levels of power to be applied to the optical storage medium.

15. The driver circuit of claim 14, wherein each latch is clocked by a corresponding one of the M clocks.

16. The driver circuit of claim 12, wherein the serializer includes M gates for receiving the M synchronized decoded data, each of the M gates also receives a corresponding one of the M clocks to perform a logical operation.

17. The driver circuit of claim 16, wherein the M gates are divided into G groups, each group having a plurality of logical gates, G being equal to a number of bias levels of power to be applied to the optical storage medium.

18. The driver circuit of claim 12, wherein the serializer includes a G-input logical OR-gate for combining the outputs of the G groups of logical gates.

19. The driver circuit of claim 12, wherein the multiphase clock generator includes:

a delay locked loop (DLL) including a first series of M first delay cells disposed in a feedback loop, each first delay cell providing a delay of N×D; and a second series of M second delay cells, each having a delay of N×D, for outputting the M clocks having M different phases respectively based on an input clock.

20. The driver circuit of claim 19, wherein N is an odd integer and D is controlled by a control voltage.

21. The driver circuit of claim 20, wherein the control voltage is generated by a filter in the delay locked loop.

* * * * *